(12) United States Patent
Hirano et al.

(10) Patent No.: US 10,737,332 B2
(45) Date of Patent: Aug. 11, 2020

(54) COATED CUTTING TOOL

(71) Applicant: TUNGALOY CORPORATION, Fukushima (JP)

(72) Inventors: Yusuke Hirano, Iwaki (JP); Hirosato Nishizawa, Iwaki (JP)

(73) Assignee: TUNGALOY CORPORATION, Iwaki-shi, Fukushima (JP)

( * ) Notice: Subject to any disclaimer, the term of this patent is extended or adjusted under 35 U.S.C. 154(b) by 190 days.

(21) Appl. No.: 16/091,004

(22) PCT Filed: Apr. 5, 2017

(86) PCT No.: PCT/JP2017/014268
§ 371 (c)(1),
(2) Date: Oct. 3, 2018

(87) PCT Pub. No.: WO2017/175803
PCT Pub. Date: Oct. 12, 2017

(65) Prior Publication Data
US 2019/0061013 A1    Feb. 28, 2019

(30) Foreign Application Priority Data

Apr. 7, 2016  (JP) .................................. 2016-076921

(51) Int. Cl.
*B23B 27/14*    (2006.01)
*C23C 28/00*    (2006.01)
(Continued)

(52) U.S. Cl.
CPC ............ *B23B 27/148* (2013.01); *B23B 27/14* (2013.01); *B23B 27/145* (2013.01); *B23C 5/16* (2013.01);
(Continued)

(58) Field of Classification Search
USPC ........... 51/307, 309; 428/336, 697, 698, 699
See application file for complete search history.

(56) References Cited

U.S. PATENT DOCUMENTS 5,882,777 A  *  3/1999  Kukino ................. C04B 41/009
                                                          51/307
8,409,702 B2 *  4/2013  Ni ....................... C23C 14/0641
                                                          428/325

(Continued)

FOREIGN PATENT DOCUMENTS

JP    H07-097679 A    4/1995

OTHER PUBLICATIONS

International Preliminary Report on Patentability and Written Opinion issued in PCT/JP2017/014268; dated Oct. 9, 2018.
(Continued)

*Primary Examiner* — Archene A Turner
(74) *Attorney, Agent, or Firm* — Studebaker & Brackett PC

(57) ABSTRACT

Provided is a coated cutting tool comprising a substrate and a coating layer formed on a surface of the substrate. The coating layer includes an alternating laminate structure of an alternating laminate of: a first composite nitride layer including a compound having a composition represented by $(Ti_xAl_{1-x})N$ (wherein x denotes an atomic ratio of the Ti element based on a total of the Ti element and the Al element and satisfies $0.10 \leq x \leq 0.35$); and a second composite nitride layer including a compound having a composition represented by $(Ti_yAl_zM_{1-y-z})N$ (wherein: M denotes an element of at least one kind selected from Zr, Hf, V, Nb, Ta, Cr, Mo, W, Si and Y; y satisfies $0.30 \leq y \leq 0.90$; z satisfies $0.10 \leq z \leq 0.70$; and y and z satisfy $y+z \leq 1$). The first composite nitride layer includes a phase having a lattice constant of from 0.400 nm or more to 0.430 nm or less and a phase (Continued)

having a lattice constant of from 0.755 nm or more to 0.810 nm or less.

20 Claims, 1 Drawing Sheet

(51) Int. Cl.
    *C23C 14/00*     (2006.01)
    *C23C 14/32*     (2006.01)
    *C23C 30/00*     (2006.01)
    *B23C 5/16*     (2006.01)
    *C23C 28/04*     (2006.01)
    *C23C 14/06*     (2006.01)
    *C23C 14/34*     (2006.01)

(52) U.S. Cl.
    CPC .......... *B23C 5/165* (2013.01); *C23C 14/0021* (2013.01); *C23C 14/0641* (2013.01); *C23C 14/325* (2013.01); *C23C 14/3442* (2013.01); *C23C 28/044* (2013.01); *C23C 28/42* (2013.01); *C23C 28/44* (2013.01); *C23C 30/005* (2013.01); *B23B 2226/125* (2013.01); *B23B 2228/10* (2013.01); *B23B 2251/50* (2013.01)

(56) References Cited

U.S. PATENT DOCUMENTS

2009/0123779 A1*   5/2009   Endler .................. C23C 30/005
                                                                  428/697
2015/0211105 A1*   7/2015   Schier ................. C23C 14/0641
                                                                  428/141

OTHER PUBLICATIONS

International Search Report issued in PCT/JP2017/014268; dated Jul. 11, 2017.

* cited by examiner

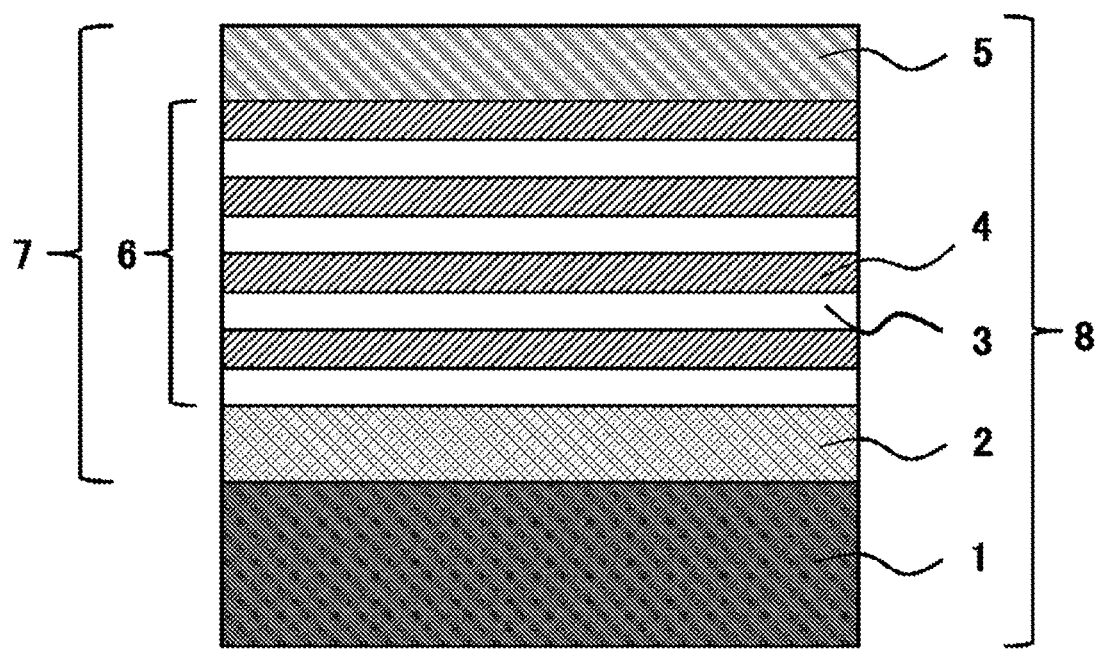

COATED CUTTING TOOL

TECHNICAL FIELD

The present invention relates to a coated cutting tool.

BACKGROUND ART

In recent years, a cutting tool having a longer tool life than in the case of a conventional cutting tool has been required, along with the improvement of highly efficient cutting. Thus, in terms of the performance required for tool materials, improvements of wear resistance and fracture resistance, which are directly related to the tool life, have been becoming increasingly important. In order to improve such characteristics, a coated cutting tool is used in which coatings are laminated in an alternating manner on a surface of a substrate.

Various techniques have been proposed in order to improve the characteristics of the above-described alternating laminate coatings. For example, Patent Document 1 proposes a coated cutting tool in which: compounds of two kinds, i.e., $Ti_xAl_{1-x}N$ and $Ti_yAl_{1-y}N$ ($0 \le x < 0.5$, $0.5 < y \le 1$) are laminated in an alternating manner; and the resulting laminate is aluminum rich in its entirety.

CITATION LIST

Patent Documents

Patent Document 1: JPH07-097679 A

SUMMARY

Technical Problem

An increase in speed, feed and depth of cut have become more conspicuous in cutting in recent times. As a result, a tool may often fracture due to either of the following points: cracking generated from a tool surface due to a load applied onto an edge during machining reaching toward a substrate; or cracking generated from a substrate due to a rapid increase/decrease in edge temperature reaching into a coating layer.

The invention disclosed in Patent Document 1 refers to a cutting tool which shows high wear resistance despite being comprised of a laminate of thin films with a lamination period of from 0.4 nm or more to 50 nm or less; however, such cutting tool has a problem in that fracturing is prone to occur therein.

The present invention has been made in order to solve these problems, and an object of the present invention is to provide a coated cutting tool which involves an improvement of fracture resistance without a reduction in wear resistance and which accordingly has a long tool life.

Solution to Problem

The present inventors have conducted studies regarding extending the tool life of a coated cutting tool and found that an improvement of fracture resistance can be achieved without a reduction in wear resistance by improving the layer configuration of a coating layer and the composition thereof, and found that, as a result, the tool life of the coated cutting tool can be extended, and this has led to the completion of the present invention.

Namely, the gist of the present invention is as set forth below.

[1] A coated cutting tool comprising a substrate and a coating layer formed on a surface of the substrate, wherein:
the coating layer includes an alternating laminate structure of an alternating laminate of:
a first composite nitride layer including a compound having a composition represented by formula (1) below:

$$(Ti_xAl_{1-x})N \qquad (1)$$

(wherein x denotes an atomic ratio of the Ti element based on a total of the Ti element and the Al element and satisfies $0.10 \le x \le 0.35$); and
a second composite nitride layer including a compound having a composition represented by formula (2) below:

$$(Ti_yAl_zM_{1-y-z})N \qquad (2)$$

(wherein: M denotes an element of at least one kind selected from the group consisting of Zr, Hf, V, Nb, Ta, Cr, Mo, W, Si and Y; y denotes an atomic ratio of the Ti element based on a total of the Ti element, the Al element and an element denoted by M; z denotes an atomic ratio of the Al element based on a total of the Ti element, the Al element and the element denoted by M; y satisfies $0.30 \le y \le 0.90$; z satisfies $0.10 \le z \le 0.70$; and y and z satisfy $y+z \le 1$); and
the first composite nitride layer includes a phase having a lattice constant of from 0.400 nm or more to 0.430 nm or less and a phase having a lattice constant of from 0.755 nm or more to 0.810 nm or less.

[2] The coated cutting tool according to [1], wherein the first composite nitride layer includes a phase having a crystal system of a cubic crystal and a lattice constant of from 0.410 nm or more to 0.420 nm or less and a phase having a crystal system of a cubic crystal and a lattice constant of from 0.770 nm or more to 0.795 nm or less.

[3] The coated cutting tool according to [1] or [2], wherein the second composite nitride layer includes a phase having a crystal system of a cubic crystal and a lattice constant of from 0.400 nm or more to 0.430 nm or less.

[4] The coated cutting tool according to any one of [1] to [3], wherein an average thickness $T_1$ of each of the layers of the first composite nitride layer is from 4 nm or more to 200 nm or less.

[5] The coated cutting tool according to any one of [1] to [4], wherein an average thickness $T_2$ of each of the layers of the second composite nitride layer is from 4 nm or more to 200 nm or less.

[6] The coated cutting tool according to any one of [1] to [5], wherein a ratio $[T_1/T_2]$ of an average thickness $T_1$ of each of the layers of the first composite nitride layer to an average thickness $T_2$ of each of the layers of the second composite nitride layer is from 0.10 or more to 1.30 or less.

[7] The coated cutting tool according to any one of [1] to [6], wherein a ratio $[T_1/T_2]$ of an average thickness $T_1$ of each of the layers of the first composite nitride layer to an average thickness $T_2$ of each of the layers of the second composite nitride layer is from 0.10 or more to 0.90 or less.

[8] The coated cutting tool according to any one of [1] to [7], wherein an average thickness of the alternating laminate structure is from 1.5 μm or more to 12.0 μm or less.

[9] The coated cutting tool according to any one of [1] to [8], wherein: the coating layer includes a lower layer between the substrate and the alternating laminate structure; the lower layer is formed of a single layer or a laminate of a compound containing an element of at least one kind selected from the group consisting of Ti, Zr, Hf, V, Nb, Ta, Cr, Mo, W, Al, Si and Y; and an element of at least one kind selected from the group consisting of C, N, O and B; and an average thickness of the lower layer is from 0.1 μm or more to 3.5 μm or less.

[10] The coated cutting tool according to any one of [1] to [9], wherein: the coating layer includes an upper layer on a surface of the alternating laminate structure; the upper layer is formed of a single layer or a laminate of a compound containing an element of at least one kind selected from the group consisting of Ti, Zr, Hf, V, Nb, Ta, Cr, Mo, W, Al, Si and Y; and an element of at least one kind selected from the group consisting of C, N, O and B; and an average thickness of the upper layer is from 0.1 μm or more to 3.5 μm or less.

[11] The coated cutting tool according to any one of [1] to [10], wherein the entire coating layer has an average thickness of from 1.5 μm or more to 15.0 μm or less.

[12] The coated cutting tool according to any one of [1] to [11], wherein the substrate is a cemented carbide, cermet, ceramic or a cubic boron nitride sintered body.

Advantageous Effects of Invention

According to the present invention, it is possible to provide a coated cutting tool which involves an improvement of fracture resistance without a reduction in wear resistance and which accordingly has a long tool life.

BRIEF DESCRIPTION OF DRAWINGS

FIG. 1 is a schematic view showing an example of a coated cutting tool according to the present invention.

DESCRIPTION OF EMBODIMENTS

An embodiment for carrying out the present invention (hereinafter simply referred to as the "present embodiment") will hereinafter be described in detail. However, the present invention is not limited to the present embodiment below. Various modifications may be made to the present invention without departing from the gist of the invention.

A coated cutting tool according to the present embodiment includes a substrate and a coating layer formed on a surface of the substrate. The substrate in the present embodiment is not particularly limited, as long as it may be used as a substrate for the coated cutting tool. Examples of the substrate include a cemented carbide, cermet, ceramic, a cubic boron nitride sintered body, a diamond sintered body and high-speed steel. From among the above examples, the substrate is further preferably comprised of at least one kind selected from the group consisting of a cemented carbide, cermet, ceramic and a cubic boron nitride sintered body because further excellent wear resistance and fracture resistance can be provided.

In the coated cutting tool of the present embodiment, if the average thickness of the entire coating layer is 1.5 μm or more, this shows the tendency of the wear resistance to be further improved. Meanwhile, if the average thickness of the entire coating layer is 15.0 μm or less, this shows the tendency of the fracture resistance to be further improved. Thus, the average thickness of the entire coating layer is preferably from 1.5 μm or more to 15.0 μm or less. In particular, from the same perspective as that set forth above, the average thickness of the entire coating layer is more preferably from 2.0 μm or more to 10.0 μm or less.

The coating layer of the present embodiment includes an alternating laminate structure in which layers of two or three kinds, each kind having a different composition, are laminated in an alternating manner. At least one layer in the alternating laminate structure includes a specific layer as described below (hereinafter referred to as a "first composite nitride layer"). The first composite nitride layer according to the present embodiment has excellent oxidation resistance because it contains a compound having a composition represented by formula (1) below.

$$(Ti_xAl_{1-x})N \quad (1)$$

The compound having the composition represented by formula (1) above in the first composite nitride layer of the present embodiment preferably contains cubic crystals, or contains cubic crystals and hexagonal crystals. In formula (1) above, x denotes an atomic ratio of the Ti element based on a total of the Ti element and the Al element, and x satisfies $0.10 \leq x \leq 0.35$. If the atomic ratio x of the Ti element is 0.10 or more, this leads to a small content of Al, thereby leading to a further reduced abundance ratio of hexagonal crystals, thereby allowing the reduction in wear resistance to be suppressed. Meanwhile, if the atomic ratio x of the Tl element is 0.35 or less, this leads to a large content of Al, thereby allowing the reduction in oxidation resistance to be suppressed. In particular, x is preferably from 0.15 or more to 0.35 or less because a more excellent balance is achieved between oxidation resistance and wear resistance, and from the same perspective, x is more preferably from 0.20 or more to 0.35 or less.

At least one layer in the alternating laminate structure of the coating layer of the present embodiment includes a specific layer as described below (hereinafter referred to as a "second composite nitride layer"). The second composite nitride layer according to the present embodiment has excellent wear resistance because it contains a compound having a composition represented by formula (2) below.

$$(Ti_yAl_zM_{1-y-z})N \quad (2)$$

The compound having the composition represented by formula (2) above in the second composite nitride layer of the present embodiment preferably contains cubic crystals, or contains cubic crystals and hexagonal crystals. In formula (2) above: M denotes an element of at least one kind selected from the group consisting of Zr, Hf, V, Nb, Ta, Cr, Mo, W, Si and Y; y denotes an atomic ratio of the Ti element based on a total of the Ti element, the Al element and an element denoted by M; z denotes an atomic ratio of the Al element based on a total of the Ti element, the Al element and the element denoted by M; y satisfies $0.30 \leq y \leq 0.90$; z satisfies $0.10 \leq z \leq 0.70$; and y and z satisfy $y+z \leq 1$. If the atomic ratio y of the Ti element is 0.30 or more, this leads to a large content of Ti, thereby allowing the reduction in wear resistance to be suppressed, whereas, if the atomic ratio y of the Ti element is 0.90 or less, this leads to a large content of Al, thereby allowing the reduction in oxidation resistance to be suppressed. If the atomic ratio z of the Al element is 0.10 or more, this leads to a large content of Al, thereby allowing the reduction in oxidation resistance to be suppressed, whereas, if the atomic ratio z of the Al element is 0.70 or less, this leads to a large content of Ti, thereby allowing the reduction in wear resistance to be suppressed. Further, the compound containing the element denoted by M leads to improvements of wear resistance and fracture resistance. In particular, the atomic ratio y of the Ti element is preferably from 0.30 or more to 0.80 or less, and/or the atomic ratio z of the Al element is preferably from 0.20 or more to 0.70 or less, because a more excellent balance is achieved between wear resistance and oxidation resistance. From the same perspective, the atomic ratio y of the Ti element is more preferably from 0.50 or more to 0.70 or less, and/or the atomic ratio z of the Al element is more preferably from 0.30 or more to 0.50 or less. Further, y+z is preferably from 0.05 or more to 0.30 or less because a more excellent balance is achieved between wear resistance and oxidation resistance, and from the same perspective, y+z is more preferably from 0.10 or more to 0.20 or less. Moreover, the element denoted by M is preferably an element of at least one kind selected from the group consisting of Zr, V, Nb, Cr, Mo, W and Si from the perspective of providing the advantageous effect of the present invention in a more effective and reliable manner.

In the present embodiment, when the composition of each composite nitride layer is represented by $(Ti_{0.35}Al_{0.65})N$, such representation indicates that the atomic ratio of the Ti element based on a total of the Ti element and the Al element is 0.35 and that the atomic ratio of the Al element based on a total of the Ti element and the Al element is 0.65. That is, such representation indicates that the amount of the Ti element based on a total of the Ti element and the Al element is 35 atom % and that the amount of the Al element based on a total of the Ti element and the Al element is 65 atom %.

If the first composite nitride layer in the coated cutting tool of the present embodiment includes a phase having a lattice constant of from 0.400 nm or more to 0.430 nm or less, such first composite nitride layer becomes dense, and the coated cutting tool therefore has excellent wear resistance. Further, if the first composite nitride layer of the coated cutting tool of the present embodiment includes a phase having a lattice constant of from 0.755 nm or more to 0.810 nm or less, this provides the effect of suppressing the progress of cracking generated during machining, and the coated cutting tool therefore has excellent fracture resistance. From the same perspective, the first composite nitride layer preferably includes a phase having a lattice constant of from 0.410 nm or more to 0.430 nm or less and a phase having a lattice constant of from 0.760 nm or more to 0.800 nm or less, and further preferably includes a phase having a lattice constant of from 0.410 nm or more to 0.420 nm or less and a phase having a lattice constant of from 0.770 nm or more to 0.795 nm or less.

In the first composite nitride layer of the coated cutting tool of the present embodiment, the crystal system of the phase having a lattice constant of from 0.400 nm or more to 0.430 nm or less is preferably a cubic crystal because the first composite nitride layer indicates the tendency of the wear resistance to be further excellent. Further, in the first composite nitride layer of the coated cutting tool of the present embodiment, the crystal system of the phase having a lattice constant of from 0.755 nm or more to 0.810 nm or less is preferably a cubic crystal because the first composite nitride layer indicates the tendency of the wear resistance to be further excellent. From the same perspective, in the first composite nitride layer, it is more preferable for each of the crystal system of the phase having a lattice constant of from 0.410 nm or more to 0.430 nm or less and the crystal system of the phase having a lattice constant of from 0.760 nm or more to 0.800 nm or less to have a cubic crystal, and it is further preferable for each of the crystal system of the phase having a lattice constant of from 0.410 nm or more to 0.420 nm or less and the crystal system of the phase having a lattice constant of from 0.770 nm or more to 0.795 nm or less to have a cubic crystal.

The second composite nitride layer in the coated cutting tool of the present embodiment preferably includes a phase having a lattice constant of from 0.400 nm or more to 0.430 nm or less, because such second composite nitride layer becomes dense, whereby the coated cutting tool has further excellent wear resistance. In the second composite nitride layer in the coated cutting tool of the present embodiment, the phase having a lattice constant of from 0.400 nm or more to 0.430 nm or less preferably has a crystal system of a cubic crystal because the second composite nitride layer indicates the tendency of the wear resistance to be more excellent.

As described above, the first composite nitride layer in the coated cutting tool of the present embodiment includes two phases having different lattice constants, thereby leading to excellent wear resistance and fracture resistance. The second composite nitride layer in the coated cutting tool of the present embodiment shows satisfactory wear resistance, particularly in the machining of steel, due to the point of having a large Ti content. Further, if the coating layer in the coated cutting tool includes an alternating laminate structure, the hardness of the coating layer is increased, thereby leading to an improvement in the wear resistance of the coated cutting tool. Moreover, if the coating layer includes an alternating laminate structure, cracking generated during machining is prone to progress in a direction parallel to the interface between the first composite nitride layer and the second composite nitride layer, and the effect of suppressing the progress of such cracking toward the substrate can therefore be provided, thereby resulting in an improvement of fracture resistance.

A lattice constant can be obtained from relational expressions (described below) between the obtained lattice spacing and the lattice constants.

Bragg equation: $2d=\lambda/\sin\theta$

Case of cubic crystals: $a^2=d^2\times(h^2+k^2+l^2)$

Case of hexagonal crystals: $a^2=d^2\times\{4/3\times(h^2+k^2+l^2)+l^2\times(c/a)^2\}$ In the expressions, d denotes lattice spacing, λ denotes the wavelength of an X-ray tube used in the measurement, θ denotes an incident angle, a denotes a lattice constant, and h, k, and l denote plane indices.

The lattice spacing and crystal system in each composite nitride layer of the present embodiment can be derived using a commercially available transmission electron microscope (TEM). For example, a thin film sample having an observation surface being a cross-sectional surface of the coating layer is produced using a focused ion beam (FIB) machining apparatus manufactured by FEI Company, and, and measurement can be performed using a TEM apparatus Tecnai Osiris (product name) manufactured by FEI Company. The crystal system of the crystal grains contained in each composite nitride layer can be derived from a selected area electron diffraction (SAD) image by irradiating a region of each composite nitride layer with an electron beam having a spot diameter corresponding to the thickness of each composite nitride layer. The lattice spacing and the crystal system of each crystal grain forming each composite nitride layer may be derived through irradiation of an electron beam corresponding to the size of each crystal grain. The lattice spacing and the crystal system of each composite nitride layer may be derived using Fourier transform software attached to the apparatus. For example, each diffraction plane index and lattice spacing can be measured using analysis software manufactured by Gatan, Inc. When analysis software is used, an image is taken preferably at a magnification allowing a lattice image of a measurement part to be observed, and more preferably at a magnification of 500,000 or more. In measurement of lattice spacing, a Fourier transform image (hereinafter referred to as the "FFT image") can be obtained by performing Fourier transform with the use of the software at resolutions of 512×512 pixels, 1024×1024 pixels, or 2048×2048 pixels. The lattice spacing can be derived from a distance between a transmitted wave (center spot) obtained at the center of the FFT image and a diffraction spot. The lattice constant can be obtained by identifying a crystal system from the ratio of distances each of which is the lattice spacing derived from the FFT image. Specifically, the lattice constant can be obtained by substituting the lattice spacing to a relational expression between a lattice constant and lattice spacing obtained for the identified crystal system. In a sample of a thin film, as to the first composite nitride layer of the present embodiment, when observing a region thereof with 1 μm in a direction parallel to a substrate, at least one phase having a lattice constant of from 0.755 nm or more to 0.810 nm or less is preferably observed.

In the coated cutting tool of the present embodiment, the average thickness $T_1$ of each of the layers of the first composite nitride layer is preferably 4 nm or more because such first composite nitride layer can be formed with a more uniform thickness. Meanwhile, the average thickness $T_1$ is preferably 200 nm or less because the hardness of the alternating laminate structure is further increased, thereby leading to a further improvement in the wear resistance of the coated cutting tool.

In the coated cutting tool of the present embodiment, the average thickness $T_2$ of each of the layers of the second composite nitride layer is preferably 4 nm or more because such second composite nitride layer can be formed with a more uniform thickness. Meanwhile, the average thickness $T_2$ is preferably 200 nm or less because the hardness of the alternating laminate structure is further increased, thereby leading to a further improvement in the wear resistance of the coated cutting tool.

In the coated cutting tool of the present embodiment, the ratio $[T_1/T_2]$ of the average thickness $T_1$ of each of the layers of the first composite nitride layer to the average thickness of $T_2$ of each of the layers of the second composite nitride layer is preferably 0.10 or more because the effect of suppressing the progress of cracking generated during machining can be exerted sufficiently. Meanwhile, the ratio $[T_1/T_2]$ between the average thicknesses is preferably 1.30 or less because a further excellent balance is achieved between wear resistance and fracture resistance. From the same perspective, the ratio $[T_1/T_2]$ of the average thickness $T_1$ of each of the layers of the first composite nitride layer to the average thickness $T_2$ of each of the layers of the second composite nitride layer is further preferably from 0.10 or more to 0.90 or less.

In the coated cutting tool of the present embodiment, if the average thickness of the alternating laminate structure is 1.5 μm or more, this indicates the tendency of the wear resistance to be further improved. Meanwhile, if the average thickness of the alternating laminate structure is 12.0 μm or less, this indicates the tendency of the fracture resistance to be further improved. Therefore, the average thickness of the alternating laminate structure is preferably from 1.5 μm or more to 12.0 μm or less.

In the present embodiment, when one first composite nitride layer and one second composite nitride layer are formed, the "number of repeats" is one. FIG. 1 is a schematic view showing an example of a cross-sectional structure of the coated cutting tool of the present embodiment, and this will be used below in order to describe the number of repeats. This coated cutting tool 8 includes a substrate 1 and a coating layer 7 formed on a surface of the substrate 1. The coating layer 7 is obtained by laminating a lower layer 2, which will be described below, an alternating laminate structure 6, and an upper layer 5, which will be described below, in order from the substrate 1 side. The alternating laminate structure 6 is obtained by laminating, in an alternating manner, a first composite nitride layer 3 and a second composite nitride layer 4, in order from the lower layer 2 side to the upper layer 5 side, and the resulting laminate includes four first composite nitride layers 3 and four second composite nitride layers 4. In such case, the number of repeats is four. Further, for example, when forming five first composite nitride layers 3 and five second composite nitride layers 4, i.e., a first composite nitride layer 3, a second composite nitride layer 4, a first composite nitride layer 3, a second composite nitride B layer 4, a first composite nitride layer 3, a second composite nitride layer 4, a first composite nitride layer 3, a second composite nitride layer 4, a first composite nitride A layer 3, and a second composite nitride layer 4, in order from the lower layer 2 side to the upper layer 5 side, the number of repeats is five. Although, in FIG. 1, the coating layer 7 includes both the lower layer 2 and the upper layer 5, the coating layer may instead include only either one of the lower layer 2 and the upper layer 5, or include neither of such two layers.

The coating layer of the present embodiment may be comprised of the alternating laminate structure alone consisting of the respective composite nitride layers. However, it is preferable for a lower layer to be provided between the substrate and the alternating laminate structure (i.e., located as a layer below the alternating laminate structure) because the adhesion between the substrate and the alternating laminate structure is further improved. In particular, the lower layer, from the same perspective as that set forth above, preferably contains a compound containing an element of at least one kind selected from the group consisting of Ti, Zr, Hf, V, Nb, Ta, Cr, Mo, W, Al, Si and Y; and an element of at least one kind selected from the group consisting of C, N, O and B, more preferably contains a compound containing an element of at least one kind selected from the group consisting of Ti, V, Nb, Cr, Mo, W, Al and Si; and an element of at least one kind selected from the group consisting of C, N, O and B, and further preferably contains a compound containing an element of at least one kind selected from the group consisting of Ti, V, Nb, Cr, Mo, W, Al and Si; and N. Further, the lower layer may be comprised of a single layer or multiple layers of two or more layers.

In the present embodiment, the average thickness of the lower layer is preferably from 0.1 μm or more to 3.5 μm or less because this indicates the tendency of the adhesion between the substrate and the coating layer to be further improved. From the same perspective, the average thickness of the lower layer is more preferably from 0.3 μm or more to 3.0 μm or less, and is further preferably from 0.5 μm or more to 3.0 μm or less.

The coating layer of the present embodiment may have an upper layer on a side of the alternating laminate structure which is opposite to the substrate (i.e., an upper layer on the alternating laminate structure), preferably on a surface of the alternating laminate structure. The upper layer further preferably contains a compound containing an element of at least one kind selected from the group consisting of Ti, Zr, Hf, V, Nb, Ta, Cr, Mo, W, Al, Si and Y; and an element of at least one kind selected from the group consisting of C, N, O and B because further excellent wear resistance is achieved. Further, from the same perspective as that set forth above, the upper layer more preferably contains a compound containing an element of at least one kind selected from the group consisting of Ti, Nb, Cr, Mo, W, Al and Si; and an element of at least one kind selected from the group consisting of C, N, O and B, and further preferably contains a compound containing an element of at least one kind selected from the group consisting of Ti, Nb, Cr, Mo, W, Al and Si; and N. Further, the upper layer may be comprised of a single layer or multiple layers of two or more layers.

In the present embodiment, the average thickness of the upper layer is preferably from 0.1 μm or more to 3.5 μm or less because this indicates the tendency of the wear resistance to be excellent. From the same perspective, the average thickness of the upper layer is more preferably from 0.2 μm or more to 2.0 μm or less, and is further preferably from 0.3 μm or more to 1.0 μm or less.

A method of manufacturing a coating layer in a coated cutting tool according to the present embodiment is not particularly limited. However, examples of such method include physical vapor deposition methods, such as an ion plating method, an arc ion plating method, a sputtering method and an ion mixing method. The coating layer is preferably formed by a physical vapor deposition method because sharp edges can be formed. In particular, the arc ion plating method is more preferable because further excellent adhesion is achieved between the coating layer and the substrate.

A method of manufacturing a coated cutting tool according to the present embodiment will be described below, using specific examples. It should be noted that the method of manufacturing a coated cutting tool according to the present embodiment is not particularly limited, as long as the configurations of the coated cutting tool may be achieved.

Firstly, a substrate processed in a tool shape is received in a reactor of a physical vapor deposition apparatus, and metal evaporation sources are placed in the reactor. Thereafter, the reactor is evacuated until the pressure therein indicates a vacuum of $1.0 \times 10^{-2}$ Pa or lower, and the substrate is heated, by a heater in the reactor, until the temperature reaches from 200° C. or higher to 700° C. or lower. After the heating, an Ar gas is introduced into the reactor so that the pressure therein is from 0.5 Pa or higher to 5.0 Pa or lower. In the Ar gas atmosphere with a pressure of from 0.5 Pa or higher to 5.0 Pa or lower, a bias voltage of from −350 V or higher to −500 V or lower is applied to the substrate, and a current of from 40 A or higher to 50 A or lower is caused to flow through a tungsten filament in the reactor, whereby an ion bombardment process is carried out, with the Ar gas, on a surface of the substrate. After the ion bombardment process is carried out on the substrate surface, the reactor is evacuated until the pressure therein indicates a vacuum of $1.0 \times 10^{-2}$ Pa or lower.

When forming the lower layer of the present embodiment, the substrate is heated until the temperature is from 150° C. or higher to 400° C. or lower. After the heating, an N₂ gas is introduced into the reactor such that the pressure therein is from 0.5 Pa or higher to 5.0 Pa or lower. Then, a bias voltage of from −80 V or higher to −50 V or lower is applied to the substrate, and a metal evaporation source according to the metal components of each layer is evaporated via an arc discharge with an arc current of from 100 A or higher to 150 A or lower, whereby the lower layer may be formed.

When forming the first composite nitride layer of the present embodiment, the substrate is controlled such that the temperature is from 150° C. or higher to 400° C. or lower, a nitrogen gas (N₂), an argon gas (Ar) and a xenon gas (Xe) are introduced in the reactor, and the pressure in the reactor is set at from 1.0 Pa or higher to 4.0 Pa or lower. Thereafter, a bias voltage of from −100 V or higher to −40 V or lower is applied to the substrate, and a metal evaporation source according to the metal components of the first composite nitride layer is evaporated via an arc discharge with an arc current of from 35 A or higher to 80 A or lower, whereby the first composite nitride layer may be formed.

In the first composite nitride layer of the present embodiment, in order to form a phase having a lattice constant of from 0.400 nm or more to 0.430 nm or less, a metal evaporation source is preferably used in which an atomic ratio of the Al element is from 0.65 or more to 0.90 or less based on a total of the Ti element and the Al element. Further, in the first composite nitride layer of the present embodiment, in order to form a phase having a lattice constant of from 0.755 nm or more to 0.810 nm or less, a metal evaporation source is preferably used in which an atomic ratio of the Al element is from 0.65 or more to 0.90 or less based on a total of the Ti element and the Al element, and further, a first composite nitride layer is preferably formed under the conditions that: the substrate temperature is a low temperature of from 150° C. or higher to 400° C. or lower; and the atmosphere in the reactor of the physical vapor deposition apparatus is a gas mixture atmosphere of an N₂ gas, an Ar gas and an Xe gas. At this time, a higher ratio of the Xe gas in the reactor tends to lead to a higher lattice constant.

When forming the second composite nitride layer of the present embodiment, the substrate is controlled such that the temperature is from 150° C. or higher to 400° C. or lower. It should be noted that the substrate temperature is preferably the same as the substrate temperature when the first composite nitride layer is formed because the first composite nitride layer and the second composite nitride layer can be formed in a continuous manner. After the temperature control, an N₂ gas, or an N₂ gas and an Ar gas, is/are introduced into the reactor so that the pressure therein is from 0.5 Pa or higher to 5.0 Pa or lower. Then, a bias voltage of from −80 V or higher to −40 V or lower is applied to the substrate, and a metal evaporation source according to the metal components of the second composite nitride layer is evaporated via an arc discharge with an arc current of from 80 A or higher to 150 A or lower, whereby the second composite nitride layer may be formed.

In order to form the alternating laminate structure of the first composite nitride layer and the second composite nitride layer, two or more kinds of metal evaporation sources are evaporated in an alternating manner via an arc discharge under the conditions set forth above, whereby the respective composite nitride layers may be formed in an alternating manner. By adjusting the arc discharge time for each of the metal evaporation sources, the thickness of each composite nitride layer which constitutes the alternating laminate structure can be controlled.

The thickness of each layer which constitutes the coating layer in the coated cutting tool of the present embodiment can be measured from a cross-sectional structure of the coated cutting tool, using an optical microscope, a scanning electron microscope (SEM), a TEM, or the like. It should be noted that, as to the average thickness of each layer in the coated cutting tool of the present embodiment, such average thickness can be obtained by: measuring the thickness of each layer, from each of the cross-sectional surfaces at three or more locations near the position 50 μm from the edge of a surface facing the metal evaporation source, toward the center of such surface; and calculating the average value (arithmetic mean) of the resulting measurements.

The composition of each layer which constitutes the coating layer in the coated cutting tool of the present embodiment can be measured from a cross-sectional structure of the coated cutting tool of the present embodiment, using an energy-dispersive X-ray spectroscope (EDS), a wavelength-dispersive X-ray spectroscope (WDS), or the like.

The coated cutting tool of the present embodiment can be considered to provide the effect of being capable of extending the tool life compared with the prior art due to the major point of having excellent wear resistance and fracture resistance (it should be noted, however, that the factor of such extension of tool life is not limited thereto). Specific examples of types of the coated cutting tool of the present embodiment include an indexable cutting insert for milling or turning, a drill and an end mill.

EXAMPLES

Although the present invention will be described in further detail below, with examples, the present invention is not limited to such examples.

Example 1

A machined cemented carbide insert with a shape of ISO standard SEEN1203AGTN and a composition of 90.2WC-9.8Co (mass %) was prepared as a substrate. In a reactor of an arc ion plating apparatus, a metal evaporation source was arranged so as to achieve the composition of each layer shown in each of Tables 1 and 2. The prepared substrate was fixed to a fixation fitting of a rotating table in the reactor.

Thereafter, the reactor was evacuated until the pressure therein indicated a vacuum of $5.0 \times 10^{-3}$ Pa or lower. After the evacuation, the substrate was heated, by a heater in the reactor, until the temperature reached 450° C. After the heating, an Ar gas was introduced into the reactor such that the pressure therein was 2.7 Pa.

In the Ar gas atmosphere with a pressure of 2.7 Pa, a bias voltage of −400 V was applied to the substrate, and a current of 40 A was caused to flow through a tungsten filament in the reactor, whereby an ion bombardment process was carried out, with the Ar gas, on a surface of the substrate for 30 minutes. After the ion bombardment process, the reactor was evacuated until the pressure therein indicated a vacuum of $5.0 \times 10^{-3}$ Pa or lower.

As to invention samples 1 to 13, after the evacuation, the substrate was controlled such that the temperature reached the temperature shown in Table 3 (temperature when the deposition was started), gases with the compositions shown in Table 3 were introduced into the reactor, and an adjustment was conducted to achieve the gas conditions with the pressure shown in Table 3 in the reactor. Thereafter, as to invention samples 1 to 13, the bias voltage shown in Table 3 was applied to the substrate, and the metal evaporation sources for the first composite nitride layer and the second composite nitride layer respectively having the compositions shown in Table 1 were evaporated in an alternating manner via an arc discharge with the arc current shown in Table 3, whereby the first composite nitride layer and the second composite nitride layer were formed on the substrate surface in an alternating manner. At this time, control was carried out so as to achieve the gas conditions and pressure, which are shown in Table 3, in the reactor. Further, with regard to each of the thicknesses of the first composite nitride layer and the second composite nitride layer, the arc discharge time was adjusted for control so as to achieve the thickness shown in Table 1.

As to comparative sample 1, after the evacuation, the substrate was controlled such that the temperature reached the temperature shown in Table 4 (temperature when the deposition was started), a gas with the composition shown in Table 4 was introduced into the reactor, and an adjustment was conducted to achieve the gas conditions with the pressure shown in Table 4 in the reactor. Thereafter, the bias voltage shown in Table 4 was applied to the substrate, and the metal evaporation source involving the composition shown in Table 2 was evaporated via an arc discharge with the arc current shown in Table 4, whereby a single layer (A layer) having the thickness shown in Table 2 was formed on the surface of the substrate.

As to comparative samples 2 to 6, after the evacuation, the substrate was controlled such that the temperature reached the temperature shown in Table 4 (temperature when the deposition was started), a gas with the composition shown in Table 4 was introduced into the reactor, and an adjustment was conducted to achieve the gas conditions with the pressure shown in Table 4 in the reactor. Thereafter, as to comparative samples 2 to 6, the bias voltage shown in Table 4 was applied to the substrate, and the metal evaporation sources for the A layer and the B layer respectively having the compositions shown in Table 2 were evaporated in an alternating manner via an arc discharge with the arc current shown in Table 4, whereby the A layer and the B layer were formed on the substrate surface in an alternating manner. At this time, control was carried out so as to achieve the gas conditions and pressure, which are shown in Table 4, in the reactor. Further, with regard to each of the thicknesses of the A layer and the B layer, the arc discharge time was adjusted for control so as to achieve the thickness shown in Table 2.

After the formation of each layer with the predetermined average thickness shown in each of Tables 1 and 2 on the substrate surface, the heater was turned off, and the sample was taken out of the reactor after the temperature of the sample reached 100° C. or lower.

TABLE 1

| | Coating layer Alternating laminate structure | | | | | | |
|---|---|---|---|---|---|---|---|
| | First composite nitride layer | | Second composite nitride layer | | | | |
| Sample No. | Composition | Average thickness $T_1$ of each of the layers (nm) | Composition | Average thickness $T_2$ of each of the layers (nm) | Number of repeats (times) | $T_1/T_2$ | Average thickness of entire coating layer (μm) |
| Invention sample 1 | $(Ti_{0.30}Al_{0.70})N$ | 50 | $(Ti_{0.50}Al_{0.50})N$ | 50 | 20 | 1.00 | 2.00 |
| Invention sample 2 | $(Ti_{0.30}Al_{0.70})N$ | 4 | $(Ti_{0.50}Al_{0.50})N$ | 4 | 250 | 1.00 | 2.00 |

TABLE 1-continued

| | Coating layer Alternating laminate structure | | | | | | |
|---|---|---|---|---|---|---|---|
| | First composite nitride layer | | Second composite nitride layer | | | | |
| Sample No. | Composition | Average thickness $T_1$ of each of the layers (nm) | Composition | Average thickness $T_2$ of each of the layers (nm) | Number of repeats (times) | $T_1/T_2$ | Average thickness of entire coating layer (μm) |
| Invention sample 3 | $(Ti_{0.30}Al_{0.70})N$ | 200 | $(Ti_{0.50}Al_{0.50})N$ | 200 | 5 | 1.00 | 2.00 |
| Invention sample 4 | $(Ti_{0.15}Al_{0.85})N$ | 10 | $(Ti_{0.70}Al_{0.30})N$ | 10 | 75 | 1.00 | 1.50 |
| Invention sample 5 | $(Ti_{0.35}Al_{0.65})N$ | 10 | $(Ti_{0.70}Al_{0.30})N$ | 10 | 200 | 1.00 | 4.00 |
| Invention sample 6 | $(Ti_{0.30}Al_{0.70})N$ | 10 | $(Ti_{0.60}Al_{0.30}Si_{0.10})N$ | 20 | 200 | 0.50 | 6.00 |
| Invention sample 7 | $(Ti_{0.20}Al_{0.80})N$ | 100 | $(Ti_{0.50}Al_{0.30}Cr_{0.20})N$ | 80 | 65 | 1.25 | 11.70 |
| Invention sample 8 | $(Ti_{0.20}Al_{0.80})N$ | 30 | $(Ti_{0.50}Al_{0.30}Nb_{0.10}W_{0.10})N$ | 150 | 30 | 0.20 | 5.40 |
| Invention sample 9 | $(Ti_{0.20}Al_{0.80})N$ | 5 | $(Ti_{0.50}Al_{0.40}Zr_{0.10})N$ | 50 | 100 | 0.10 | 5.50 |
| Invention sample 10 | $(Ti_{0.35}Al_{0.65})N$ | 150 | $(Ti_{0.50}Al_{0.40}Mo_{0.10})N$ | 170 | 15 | 0.88 | 4.80 |
| Invention sample 11 | $(Ti_{0.35}Al_{0.65})N$ | 180 | $(Ti_{0.40}Al_{0.50}V_{0.10})N$ | 200 | 10 | 0.90 | 3.80 |
| Invention sample 12 | $(Ti_{0.15}Al_{0.85})N$ | 220 | $(Ti_{0.80}Al_{0.20})N$ | 210 | 10 | 1.05 | 4.30 |
| Invention sample 13 | $(Ti_{0.20}Al_{0.80})N$ | 60 | $(Ti_{0.70}Al_{0.20}V_{0.10})N$ | 40 | 40 | 1.50 | 4.00 |

TABLE 2

| | Coating layer Alternating laminate structure | | | | | | |
|---|---|---|---|---|---|---|---|
| | A layer | | B layer | | | | |
| Sample No. | Composition | Average thickness $T_1$ of each of the layers (nm) | Composition | Average thickness $T_2$ of each of the layers (nm) | Number of repeats (times) | $T_1/T_2$ | Average thickness of entire coating layer (μm) |
| Comparative sample 1 | | | $(Ti_{0.50}Al_{0.50})N$ single layer | | | | 3.00 |
| Comparative sample 2 | $(Ti_{0.40}Al_{0.60})N$ | 10 | $(Ti_{0.50}Al_{0.50})N$ | 10 | 200 | 1.00 | 4.00 |
| Comparative sample 3 | $(Ti_{0.30}Al_{0.70})N$ | 50 | $(Ti_{0.50}Al_{0.50})N$ | 50 | 40 | 1.00 | 4.00 |
| Comparative sample 4 | $(Ti_{0.20}Al_{0.80})N$ | 100 | $(Ti_{0.70}Al_{0.30})N$ | 120 | 15 | 0.83 | 3.30 |
| Comparative sample 5 | $(Ti_{0.35}Al_{0.65})N$ | 2 | $(Ti_{0.50}Al_{0.30}Cr_{0.20})N$ | 4 | 900 | 0.50 | 5.40 |
| Comparative sample 6 | $(Ti_{0.35}Al_{0.65})N$ | 150 | $(Ti_{0.50}Al_{0.30}Nb_{0.10}W_{0.10})N$ | 120 | 20 | 1.25 | 5.40 |

* For the purposes of description, the "average thickness of each of the layers" of the A layer is denoted as $T_1$, and the "average thickness of each of the layers" of the B layer is denoted as $T_2$.

TABLE 3

| | | | Gas conditions | | | | | |
|---|---|---|---|---|---|---|---|---|
| | Deposition | | First composite nitride layer | | | Second composite nitride layer | | |
| Sample No. | temperature (°C.) | Pressure (Pa) | $N_2$ (vol %) | Ar (vol %) | Xe (vol %) | $N_2$ (vol %) | Bias voltage (V) | Arc current (A) |
| Invention sample 1 | 150 | 2.0 | 60 | 38 | 2 | 100 | −40 | 60 |
| Invention sample 2 | 250 | 2.0 | 60 | 32 | 8 | 100 | −50 | 60 |
| Invention sample 3 | 250 | 2.0 | 60 | 32 | 8 | 100 | −50 | 60 |
| Invention sample 4 | 250 | 3.0 | 60 | 39.5 | 0.5 | 100 | −60 | 40 |
| Invention sample 5 | 250 | 3.0 | 60 | 38 | 2 | 100 | −60 | 40 |

TABLE 3-continued

| | | | Gas conditions | | | | | |
| | | | First composite nitride layer | | | Second composite nitride layer | | |
| Sample No. | Deposition temperature (° C.) | Pressure (Pa) | $N_2$ (vol %) | Ar (vol %) | Xe (vol %) | $N_2$ (vol %) | Bias voltage (V) | Arc current (A) |
|---|---|---|---|---|---|---|---|---|
| Invention sample 6 | 350 | 3.0 | 60 | 30 | 10 | 100 | −70 | 80 |
| Invention sample 7 | 350 | 1.0 | 40 | 56 | 4 | 100 | −70 | 80 |
| Invention sample 8 | 350 | 1.0 | 40 | 56 | 4 | 100 | −80 | 60 |
| Invention sample 9 | 350 | 1.0 | 40 | 52 | 8 | 100 | −80 | 60 |
| Invention sample 10 | 400 | 4.0 | 40 | 59.5 | 0.5 | 100 | −60 | 35 |
| Invention sample 11 | 400 | 4.0 | 40 | 59.5 | 0.5 | 100 | −60 | 35 |
| Invention sample 12 | 250 | 3.0 | 40 | 54 | 6 | 100 | −50 | 80 |
| Invention sample 13 | 250 | 3.0 | 40 | 54 | 6 | 100 | −50 | 80 |

TABLE 4

| | | | Gas conditions | | | | | |
| | | | A layer | | | B layer | | |
| Sample No. | Deposition temperature (° C.) | Pressure (Pa) | $N_2$ (vol %) | Ar (vol %) | Xe (vol %) | $N_2$ (vol %) | Bias voltage (V) | Arc current (A) |
|---|---|---|---|---|---|---|---|---|
| Comparative sample 1 | 300 | 3.0 | 100 | 0 | 0 | — | −50 | 60 |
| Comparative sample 2 | 250 | 2.0 | 100 | 0 | 0 | 100 | −80 | 60 |
| Comparative sample 3 | 500 | 2.0 | 100 | 0 | 0 | 100 | −80 | 60 |
| Comparative sample 4 | 500 | 2.0 | 100 | 0 | 0 | 100 | −60 | 40 |
| Comparative sample 5 | 500 | 2.0 | 60 | 40 | 0 | 100 | −40 | 60 |
| Comparative sample 6 | 500 | 2.0 | 40 | 60 | 0 | 100 | −40 | 60 |

* The "—" symbol in the "$N_2$" column for the "B layer" indicates that a B layer is not formed.

As to the average thickness of each layer of each of the obtained samples, such average thickness was obtained by: measuring the thickness of each layer via a TEM observation of each of the cross-sectional surfaces at three locations near the position 50 μm from the edge of a surface facing the metal evaporation source of the coated cutting tool, toward the center of such surface; and calculating the average value (arithmetic mean) of the resulting measurements. Further, the obtained average thickness $T_1$ of each of the layers of the first composite nitride layer and the obtained average thickness $T_2$ of each of the layers of the second composite nitride layer were used to calculate the ratio $[T_1/T_2]$ of the average thickness $T_1$ of each of the layers of the first composite nitride layer to the average thickness $T_2$ of each of the layers of the second composite nitride layer. The results are shown in Tables 1 and 2. For the purposes of description, in each comparative sample, the "average thickness of each of the layers" of the A layer was denoted by $T_1$, and the "average thickness of each of the layers" of the B layer was denoted by $T_2$.

The composition of each layer of the obtained sample was measured from the cross-sectional surface near the position at most 50 μm from the edge of a surface facing the metal evaporation source of the coated cutting tool, toward the center of such surface, using an EDS attached to a TEM. The measurement results are shown in Tables 1 and 2. It should be noted that the composition ratio of the metal elements of each layer in each of Tables 1 and 2 refers to an atomic ratio of each metal element relative to all the metal elements in the metal compound which constitutes each layer.

The lattice constant and the crystal system of the obtained sample were derived using a commercially available TEM. A thin film sample having an observation surface being a cross-sectional surface of the coating layer was produced using the FIB machining apparatus manufactured by FEI Company. Then, a lattice image of each composite nitride layer was taken at a magnification of 500,000 using the TEM apparatus Tecnai Osiris (product name) manufactured by FEI Company. An FFT image was obtained from the taken image using the analysis software manufactured by Gatan, Inc. Lattice spacing was derived from a distance between an intensity (center spot) obtained at the center of the FFT image and a diffraction spot, and the crystal system and the lattice constant were obtained. The results are shown in Tables 5 and 6. As to each of the comparative samples, the crystal systems and lattice constants of the A layer and the B layer were measured.

TABLE 5

| Sample No. | First composite nitride layer | | | | Second composite nitride layer | |
|---|---|---|---|---|---|---|
| | Phase 1 | | Phase 2 | | | |
| | Crystal system | Lattice constant (nm) | Crystal system | Lattice constant (nm) | Crystal system | Lattice constant (nm) |
| Invention sample 1 | Cubic crystal | 0.418 | Cubic crystal | 0.773 | Cubic crystal | 0.422 |
| Invention sample 2 | Cubic crystal | 0.418 | Cubic crystal | 0.785 | Cubic crystal | 0.421 |
| Invention sample 3 | Cubic crystal | 0.417 | Cubic crystal | 0.786 | Cubic crystal | 0.422 |
| Invention sample 4 | Cubic crystal | 0.410 | Cubic crystal | 0.769 | Cubic crystal | 0.425 |
| Invention sample 5 | Cubic crystal | 0.420 | Cubic crystal | 0.772 | Cubic crystal | 0.426 |
| Invention sample 6 | Cubic crystal | 0.417 | Cubic crystal | 0.792 | Cubic crystal | 0.424 |
| Invention sample 7 | Cubic crystal | 0.413 | Cubic crystal | 0.778 | Cubic crystal | 0.421 |
| Invention sample 8 | Cubic crystal | 0.411 | Cubic crystal | 0.780 | Cubic crystal | 0.420 |
| Invention sample 9 | Cubic crystal | 0.412 | Cubic crystal | 0.781 | Cubic crystal | 0.421 |
| Invention sample 10 | Cubic crystal | 0.420 | Cubic crystal | 0.770 | Cubic crystal | 0.422 |
| Invention sample 11 | Cubic crystal | 0.421 | Cubic crystal | 0.768 | Cubic crystal | 0.419 |
| Invention sample 12 | Cubic crystal | 0.411 | Cubic crystal | 0.782 | Cubic crystal | 0.427 |
| Invention sample 13 | Cubic crystal | 0.411 | Cubic crystal | 0.782 | Cubic crystal | 0.427 |

TABLE 6

| Sample No. | A layer | | | | B layer | |
|---|---|---|---|---|---|---|
| | Phase 1 | | Phase 2 | | | |
| | Crystal system | Lattice constant (nm) | Crystal system | Lattice constant (nm) | Crystal system | Lattice constant (nm) |
| Comparative sample 1 | Cubic crystal | 0.422 | None | None | None | None |
| Comparative sample 2 | Cubic crystal | 0.419 | None | None | Cubic crystal | 0.421 |
| Comparative sample 3 | Cubic crystal | 0.416 | Hexagonal crystal | a = b = 3.114, c = 4.978 | Cubic crystal | 0.422 |
| Comparative sample 4 | Cubic crystal | 0.412 | Hexagonal crystal | a = b = 3.114, c = 4.979 | Cubic crystal | 0.426 |
| Comparative sample 5 | Cubic crystal | 0.420 | None | None | Cubic crystal | 0.421 |
| Comparative sample 6 | Cubic crystal | 0.421 | None | None | Cubic crystal | 0.420 |

Using the obtained samples, the following cutting tests were conducted in order to perform evaluations.

[Cutting Test: Wear Resistance Test]

Workpiece: SCM440

Workpiece shape: Rectangular parallelepiped of 120 mm×230 mm×60 mm

Cutting speed: 260 m/min

Feed: 0.15 mm/tooth

Depth of cut: 2.0 mm

Coolant: Not used

Width of cut: 50 mm

Evaluation items: A time when a sample had a flank wear width of 0.2 mm was defined as the end of the tool life, and the machining length to reach the end of the tool life was measured.

[Cutting Test: Fracture Resistance Test]

Workpiece: SCM440

Workpiece shape: Rectangular parallelepiped of 120 mm×230 mm×60 mm (The 120 mm×230 mm surface of the rectangular parallelepiped on which face milling was performed was provided with four holes each having a diameter of φ30 mm.)

Cutting speed: 240 m/min

Feed: 0.40 mm/tooth

Depth of cut: 2.2 mm

Coolant: Not used
Width of cut: 105 mm
Evaluation items: A time when a sample was fractured (chipping occurred in the cutting edge of a sample) was defined as the end of the tool life, and the machining length to reach the end of the tool life was measured.

As to the machining length to reach the end of the tool life in the test on wear resistance, evaluations were made with grade "A" for 9.5 m or more, grade "B" for 8.5 m or more and less than 9.5 m, and grade "C" for less than 8.5 m. Further, as to the machining length to reach the end of the tool life in the test on fracture resistance, evaluations were made with grade "A" for 6.0 m or more, grade "B" for 5.0 m or more and less than 6.0 m, and grade "C" for less than 5.0 m. In such evaluations, "A" refers to excellent, "B" refers to good and "C" refers to inferior, meaning that a sample involving a larger number of grade "A"s or "B"s has more excellent cutting performance. The evaluation results are shown in Table 7.

TABLE 7

| | Cutting test | | | |
| --- | --- | --- | --- | --- |
| | Wear resistance test | | Fracture resistance test | |
| Sample No. | Machining length (m) | Grade | Machining length (m) | Grade |
| Invention sample 1 | 8.9 | B | 5.6 | B |
| Invention sample 2 | 8.7 | B | 5.7 | B |
| Invention sample 3 | 9.0 | B | 5.4 | B |
| Invention sample 4 | 8.5 | B | 5.3 | B |
| Invention sample 5 | 10.0 | A | 7.0 | A |
| Invention sample 6 | 10.8 | A | 7.2 | A |
| Invention sample 7 | 11.1 | A | 6.0 | A |
| Invention sample 8 | 9.8 | A | 6.2 | A |
| Invention sample 9 | 9.9 | A | 6.5 | A |
| Invention sample 10 | 9.5 | A | 6.0 | A |
| Invention sample 11 | 9.3 | B | 6.1 | A |
| Invention sample 12 | 9.3 | B | 6.0 | A |
| Invention sample 13 | 9.2 | B | 6.5 | A |
| Comparative sample 1 | 7.5 | C | 3.8 | C |
| Comparative sample 2 | 8.8 | B | 4.5 | C |
| Comparative sample 3 | 7.7 | C | 4.0 | C |
| Comparative sample 4 | 7.5 | C | 4.1 | C |
| Comparative sample 5 | 8.5 | B | 4.7 | C |
| Comparative sample 6 | 8.7 | B | 4.4 | C |

The results of Table 7 show that each invention sample had grade "B" or higher in the wear resistance test and that each comparative sample had grade "B" or "C" therein. Accordingly, it is apparent that the wear resistance of each invention sample is equal to or better than that of each comparative sample.

The results of Table 7 further show that each invention sample had grade "A" or "B" in the fracture resistance test and that each comparative sample had grade "C" therein.

It is apparent from the above results that each invention sample has improved fracture resistance without a reduction in wear resistance and accordingly has a long tool life.

Example 2

A machined cemented carbide insert with a shape of ISO standard SEEN1203AGTN and a composition of 90.2WC-9.8Co (mass %) was prepared as a substrate. In a reactor of an arc ion plating apparatus, a metal evaporation source was arranged so as to achieve the composition of each layer shown in each of Tables 8 and 9. The prepared substrate was fixed to a fixation fitting of a rotating table in the reactor.

Thereafter, the reactor was evacuated until the pressure therein indicated a vacuum of $5.0 \times 10^{-3}$ Pa or lower. After the evacuation, the substrate was heated, by a heater in the reactor, until the temperature reached 450° C. After the heating, an Ar gas was introduced into the reactor such that the pressure therein was 2.7 Pa.

In the Ar gas atmosphere with a pressure of 2.7 Pa, a bias voltage of −400 V was applied to the substrate, and a current of 40 A was caused to flow through a tungsten filament in the reactor, whereby an ion bombardment process was carried out, with the Ar gas, on a surface of the substrate for 30 minutes. After the ion bombardment process, the reactor was evacuated until the pressure therein indicated a vacuum of $5.0 \times 10^{-3}$ Pa or lower.

As to invention samples 14 to 17, after the evacuation, the substrate was heated until the temperature reached 350° C., and an $N_2$ gas was introduced into the reactor such that the pressure therein was 3.0 Pa. Thereafter, a bias voltage of −50 V was applied to the substrate, and the metal evaporation source involving the composition shown in Table 8 was evaporated via an arc discharge with an arc current of 120 A, whereby the lower layer was formed.

Then, as to invention samples 14 to 17, the substrate was controlled such that the temperature reached the temperature shown in Table 10 (temperature when the deposition was started), the gas having the composition shown in Table 10 was introduced into the reactor, and an adjustment was conducted to achieve the gas condition of the pressure shown in Table 10 in the reactor. Thereafter, as to invention samples 14 to 17, the bias voltage shown in Table 10 was applied to the substrate, and the metal evaporation sources for the first composite nitride layer and the second composite nitride layer respectively having the compositions shown in Table 8 were evaporated in an alternating manner via the arc discharge shown in Table 10, whereby the first composite nitride layer and the second composite nitride layer were formed on the surface of the lower layer in an alternating manner. At this time, control was carried out so as to achieve the gas conditions and pressure, which are shown in Table 10, in the reactor. Further, with regard to each of the thicknesses of the first composite nitride layer and the second composite nitride layer, the arc discharge time was adjusted for control so as to achieve the thickness shown in Table 8.

Next, as to invention samples 14 to 17, after the evacuation, the substrate was heated until the temperature reached 350° C., and an $N_2$ gas was introduced into the reactor such that the pressure therein was 3.0 Pa. Thereafter, a bias voltage of −50 V was applied to the substrate, and the metal evaporation source involving the composition shown in Table 8 was evaporated via an arc discharge with an arc current of 120 A, whereby the upper layer was formed.

As to comparative samples 6 to 9, after the evacuation, the substrate was heated until the temperature reached 350° C., and an $N_2$ gas was introduced into the reactor such that the pressure therein was 3.0 Pa. Thereafter, a bias voltage of −50 V was applied to the substrate, and the metal evaporation source involving the composition shown in Table 9 was evaporated via an arc discharge with an arc current of 120 A, whereby the lower layer was formed.

Then, as to comparative samples 6 to 9, the substrate was controlled such that the temperature reached the temperature shown in Table 11 (temperature when the deposition was started), a gas with the composition shown in Table 11 was introduced into the reactor, and an adjustment was conducted to achieve the gas condition of the pressure shown in Table 11 in the reactor. Thereafter, as to comparative samples 6 to 9, the bias voltage shown in Table 11 was applied to the substrate, and the metal evaporation sources for the A layer and the B layer respectively having the compositions shown in Table 9 were evaporated in an alternating manner via an arc discharge with the arc current shown in Table 11, whereby the A layer and the B layer were formed on the surface of the lower layer in an alternating manner. At this time, control was carried out so as to achieve the gas conditions and pressure, which are shown in Table 11, in the reactor. Further, with regard to each of the thicknesses of the A layer and the B layer, the arc discharge time was adjusted for control so as to achieve the thickness shown in Table 9.

Then, as to invention samples 6 to 9, after the evacuation, the substrate was heated until the temperature reached 350° C., and an $N_2$ gas was introduced into the reactor such that the pressure therein was 3.0 Pa. Thereafter, a bias voltage of −50 V was applied to the substrate, and the metal evaporation source involving the composition shown in Table 9 was evaporated via an arc discharge with an arc current of 120 A, whereby the upper layer was formed.

After the formation of each layer with the predetermined average thickness shown in each of Tables 8 and 9 on the substrate surface, the heater was turned off, and the sample was taken out of the reactor after the temperature of the sample reached 100° C. or lower.

TABLE 8

| | Coating layer | | | | | |
|---|---|---|---|---|---|---|
| | | | | Alternating laminate structure | | |
| | | | | First composite nitride layer | | Second composite nitride layer | |
| | Lower layer | | | | Average thickness of | | Average thickness of |
| Sample No. | Composition | | Average thickness (μm) | Composition | each of the layers (nm) | Composition | each of the layers (nm) |
| Invention sample 14 | $(Ti_{0.65}Al_{0.35})N$ | | 0.5 | $(Ti_{0.30}Al_{0.70})N$ | 50 | $(Ti_{0.50}Al_{0.50})N$ | 50 |
| Invention sample 15 | $(Ti_{0.20}Al_{0.30}Nb_{0.20}W_{0.20}Mo_{0.10})N$ | | 0.3 | $(Ti_{0.30}Al_{0.70})N$ | 4 | $(Ti_{0.50}Al_{0.50})N$ | 4 |
| Invention sample 16 | $(Al_{0.50}Cr_{0.30}Si_{0.20})N$ | | 2.0 | $(Ti_{0.30}Al_{0.70})N$ | 200 | $(Ti_{0.50}Al_{0.50})N$ | 200 |
| Invention sample 17 | $(Al_{0.50}Cr_{0.30}V_{0.20})N$ | | 1.0 | $(Ti_{0.15}Al_{0.85})N$ | 10 | $(Ti_{0.70}Al_{0.30})N$ | 10 |

| | Coating layer | | | | | |
|---|---|---|---|---|---|---|
| | Alternating laminate structure | | | | Upper layer | Average |
| Sample No. | Number of repeats (times) | Average thickness (μm) | $T_1/T_2$ | Composition | Average thickness (μm) | thickness of entire coating layer (μm) |
| Invention sample 14 | 20 | 2.00 | 1.00 | $(Ti_{0.65}Al_{0.35})N$ | 1.0 | 3.50 |
| Invention sample 15 | 250 | 2.00 | 1.00 | NbN | 0.3 | 2.60 |
| Invention sample 16 | 5 | 2.00 | 1.00 | $(Ti_{0.20}Al_{0.30}Nb_{0.20}W_{0.20}Mo_{0.10})N$ | 2.0 | 6.00 |
| Invention sample 17 | 75 | 1.50 | 1.00 | $(Al_{0.50}Cr_{0.30}Si_{0.20})N$ | 1.5 | 4.00 |

TABLE 9

| | Coating layer | | | | | |
|---|---|---|---|---|---|---|
| | Lower layer | | Alternating laminate structure | | | |
| | | | A layer | | B layer | |
| Sample No. | Composition | Average thickness (μm) | Composition | Average thickness of each of the layers (nm) | Composition | Average thickness of each of the layers (nm) |
| Comparative sample 6 | $(Ti_{0.65}Al_{0.35})N$ | 0.5 | $(Ti_{0.40}Al_{0.60})N$ | 10 | $(Ti_{0.50}Al_{0.50})N$ | 10 |
| Comparative sample 7 | $(Ti_{0.20}Al_{0.30}Nb_{0.20}W_{0.20}Mo_{0.10})N$ | 0.3 | $(Ti_{0.20}Al_{0.80})N$ | 100 | $(Ti_{0.70}Al_{0.30})N$ | 120 |
| Comparative sample 8 | $(Al_{0.50}Cr_{0.30}Si_{0.20})N$ | 2.0 | $(Ti_{0.35}Al_{0.65})N$ | 2 | $(Ti_{0.50}Al_{0.30}Cr_{0.20})N$ | 4 |
| Comparative sample 9 | $(Al_{0.50}Cr_{0.30}V_{0.20})N$ | 1.0 | $(Ti_{0.35}Al_{0.65})N$ | 150 | $(Ti_{0.20}Al_{0.30}Nb_{0.20}W_{0.10})N$ | 120 |

| | Coating layer | | | | | |
|---|---|---|---|---|---|---|
| | Alternating laminate structure | | | Upper layer | | Average thickness of entire coating layer (μm) |
| Sample No. | Number of repeats (times) | $T_1/T_2$ | Average thickness (μm) | Composition | Average thickness (μm) | |
| Comparative sample 6 | 200 | 1.00 | 4.00 | $(Ti_{0.65}Al_{0.35})N$ | 0.5 | 5.00 |
| Comparative sample 7 | 15 | 0.83 | 3.30 | $(Ti_{0.20}Al_{0.30}Nb_{0.20}W_{0.20}Mo_{0.10})N$ | 0.3 | 3.90 |
| Comparative sample 8 | 900 | 0.50 | 5.40 | $(Al_{0.50}Cr_{0.30}Si_{0.20})N$ | 2.0 | 9.40 |
| Comparative sample 9 | 20 | 1.25 | 5.40 | $(Al_{0.50}Cr_{0.30}V_{0.20})N$ | 1.0 | 7.40 |

TABLE 10

| | Deposition | | Gas conditions | | | | Bias voltage (V) | Arc current (A) |
|---|---|---|---|---|---|---|---|---|
| | | | First composite nitride layer | | | Second composite nitride layer | | |
| Sample No. | temperature (° C.) | Pressure (Pa) | $N_2$ (vol %) | Ar (vol %) | Xe (vol %) | $N_2$ (vol %) | | |
| Invention sample 14 | 200 | 3.0 | 50 | 48 | 2 | 100 | −60 | 50 |
| Invention sample 15 | 200 | 2.0 | 50 | 42 | 8 | 100 | −40 | 70 |
| Invention sample 16 | 300 | 2.0 | 50 | 42 | 8 | 100 | −40 | 70 |
| Invention sample 17 | 300 | 4.0 | 50 | 49.5 | 0.5 | 100 | −60 | 35 |

TABLE 11

| | Deposition | | Gas conditions | | | | Bias voltage (V) | Arc current (A) |
|---|---|---|---|---|---|---|---|---|
| | | | A layer | | | B layer | | |
| Sample No. | temperature (° C.) | Pressure (Pa) | $N_2$ (vol %) | Ar (vol %) | Xe (vol %) | $N_2$ (vol %) | | |
| Comparative sample 6 | 250 | 2.0 | 100 | 0 | 0 | 100 | −40 | 50 |
| Comparative sample 7 | 500 | 2.0 | 100 | 0 | 0 | 100 | −60 | 50 |
| Comparative sample 8 | 500 | 2.0 | 60 | 40 | 0 | 100 | −80 | 70 |

TABLE 11-continued

| | | | Gas conditions | | | | | |
| | Deposition | | A layer | | | B layer | | |
| Sample No. | temperature (° C.) | Pressure (Pa) | $N_2$ (vol %) | Ar (vol %) | Xe (vol %) | $N_2$ (vol %) | Bias voltage (V) | Arc current (A) |
|---|---|---|---|---|---|---|---|---|
| Comparative sample 9 | 500 | 2.0 | 40 | 60 | 0 | 100 | −60 | 70 |

As to the average thickness of each layer of each of the obtained samples, such average thickness was obtained by: measuring the thickness of each layer via a TEM observation of each of the cross-sectional surfaces at three locations near the position 50 µm from the edge of a surface facing the metal evaporation source of the coated cutting tool, toward the center of such surface; and calculating the average value (arithmetic mean) of the resulting measurements. Further, the obtained average thickness $T_1$ of each of the layers of the first composite nitride layer and the obtained average thickness $T_2$ of each of the layers of the second composite nitride layer were used to calculate the ratio $[T_1/T_2]$ of the average thickness $T_1$ of each of the layers of the first composite nitride layer to the average thickness $T_2$ of each of the layers of the second composite nitride layer. The results are shown in Tables 8 and 9. For the purposes of description, in each comparative sample, the "average thickness of each of the layers" of the A layer was denoted by $T_1$, and the "average thickness of each of the layers" of the B layer was denoted by $T_2$.

The composition of each layer of the obtained sample was measured from the cross-sectional surface near the position at most 50 µm from the edge of a surface facing the metal evaporation source of the coated cutting tool, toward the center of such surface, using an EDS attached to a TEM. The measurement results are shown in Tables 8 and 9. It should be noted that the composition ratio of the metal elements of each layer in each of Tables 8 and 9 refers to an atomic ratio of each metal element relative to all the metal elements in the metal compound which constitutes each layer.

The lattice constant and the crystal system of the obtained sample were derived using a commercially available TEM. A thin film sample having an observation surface being a cross-sectional surface of the coating layer was produced using the FIB machining apparatus manufactured by FEI Company. Then, a lattice image of each composite nitride layer was taken at a magnification of 500,000 using the TEM apparatus Tecnai Osiris (product name) manufactured by FEI Company. An FFT image was obtained from the taken image using the analysis software manufactured by Gatan, Inc. Lattice spacing was derived from a distance between an intensity (center spot) obtained at the center of the FFT image and a diffraction spot, and the crystal system and the lattice constant were obtained. The results are shown in Tables 12 and 13. As to each of the comparative samples, the crystal systems and lattice constants of the A layer and the B layer were measured.

TABLE 12

| | First composite nitride layer | | | | Second composite nitride layer | |
| | Phase 1 | | Phase 2 | | | |
| Sample No. | Crystal system | Lattice constant (nm) | Crystal system | Lattice constant (nm) | Crystal system | Lattice constant (nm) |
|---|---|---|---|---|---|---|
| Invention sample 14 | Cubic | 0.418 | Cubic | 0.773 | Cubic | 0.422 |
| Invention sample 15 | Cubic | 0.418 | Cubic | 0.785 | Cubic | 0.421 |
| Invention sample 16 | Cubic | 0.417 | Cubic | 0.786 | Cubic | 0.422 |
| Invention sample 17 | Cubic | 0.410 | Cubic | 0.769 | Cubic | 0.425 |

TABLE 13

| | A layer | | | | B layer | |
| | Phase 1 | | Phase 2 | | | |
| Sample No. | Crystal system | Lattice constant (nm) | Crystal system | Lattice constant (nm) | Crystal system | Lattice constant (nm) |
|---|---|---|---|---|---|---|
| Comparative sample 6 | Cubic | 0.419 | None | None | Cubic | 0.421 |
| Comparative sample 7 | Cubic | 0.412 | Hexagonal | a = b = 3.114, c = 4.979 | Cubic | 0.426 |
| Comparative sample 8 | Cubic | 0.420 | None | None | Cubic | 0.421 |
| Comparative sample 9 | Cubic | 0.421 | None | None | Cubic | 0.420 |

Using the obtained samples, the same cutting tests as in Example 1 were conducted in order to perform evaluations. As to the machining length to reach the end of the tool life in the test on wear resistance, evaluations were made with grade "A" for 9.5 m or more, grade "B" for 8.5 m or more and less than 9.5 m, and grade "C" for less than 8.5 m. Further, as to the machining length to reach the end of the tool life in the test on fracture resistance, evaluations were made with grade "A" for 6.0 m or more, grade "B" for 5.0 m or more and less than 6.0 m, and grade "C" for less than 5.0 m. In such evaluations, "A" refers to excellent, "B" refers to good and "C" refers to inferior, meaning that a sample involving a larger number of grade "A"s or "B"s has more excellent cutting performance. The evaluation results are shown in Table 14.

TABLE 14

| | Cutting test | | | |
|---|---|---|---|---|
| | Wear resistance test | | Fracture resistance test | |
| Sample No. | Machining length (m) | Grade | Machining length (m) | Grade |
| Invention sample 14 | 9.4 | B | 6.0 | A |
| Invention sample 15 | 9.0 | B | 5.8 | B |
| Invention sample 16 | 10.4 | A | 6.2 | A |
| Invention sample 17 | 9.7 | A | 5.5 | B |
| Comparative sample 6 | 9.2 | B | 4.8 | C |
| Comparative sample 7 | 7.7 | C | 4.2 | C |
| Comparative sample 8 | 9.2 | B | 3.6 | C |
| Comparative sample 9 | 9.1 | B | 3.8 | C |

The results of Table 14 show that each invention sample had grade "B" or higher in the wear resistance test and that each comparative sample had grade "B" or "C" therein. Accordingly, it is apparent that the wear resistance of each invention sample is equal to or better than that of each comparative sample.

The results of Table 14 further show that each invention sample had grade "A" or "B" in the fracture resistance test and that each comparative sample had grade "C" therein.

Accordingly, it is apparent that each invention sample has excellent wear resistance and fracture resistance and accordingly has a long tool life, even if it includes the upper layer and the lower layer.

The present application is based on the Japanese patent application filed on Apr. 7, 2016 (JP Appl. 2016-076921), the content of which is incorporated herein by reference.

INDUSTRIAL APPLICABILITY

The coated cutting tool according to the present invention has excellent wear resistance and fracture resistance, whereby the tool life can be extended more than that involved in the prior art, and the coated cutting tool therefore has high industrial applicability.

REFERENCE SIGNS LIST

1: Substrate, 2: Lower layer, 3: First composite nitride layer, 4: Second composite nitride layer, 5: Upper layer, 6: Alternating laminate structure, 7: Coating layer, 8: Coated cutting tool.

What is claimed is:

1. A coated cutting tool comprising a substrate and a coating layer formed on a surface of the substrate, wherein:
   the coating layer includes an alternating laminate structure of an alternating laminate of:
   a first composite nitride layer including a compound having a composition represented by formula (1) below:

$$(Ti_xAl_{1-x})N \quad (1)$$

(wherein x denotes an atomic ratio of the Ti element based on a total of the Ti element and the Al element and satisfies $0.10 \leq x \leq 0.35$); and a second composite nitride layer including a compound having a composition represented by formula (2) below:

$$(Ti_yAl_zM_{1-y-z})N \quad (2)$$

(wherein: M denotes an element of at least one kind selected from the group consisting of Zr, Hf, V, Nb, Ta, Cr, Mo, W, Si and Y; y denotes an atomic ratio of the Ti element based on a total of the Ti element, the Al element and an element denoted by M; z denotes an atomic ratio of the Al element based on a total of the Ti element, the Al element and the element denoted by M; y satisfies $0.30 \leq y \leq 0.90$; z satisfies $0.10 \leq z \leq 0.70$; and y and z satisfy $y+z \leq 1$); and
   the first composite nitride layer includes a phase having a lattice constant of from 0.400 nm or more to 0.430 nm or less and a phase having a lattice constant of from 0.755 nm or more to 0.810 nm or less.

2. The coated cutting tool according to claim 1, wherein the first composite nitride layer includes a phase having a crystal system of a cubic crystal and a lattice constant of from 0.410 nm or more to 0.420 nm or less and a phase having a crystal system of a cubic crystal and a lattice constant of from 0.770 nm or more to 0.795 nm or less.

3. The coated cutting tool according to claim 1, wherein the second composite nitride layer includes a phase having a crystal system of a cubic crystal and a lattice constant of from 0.400 nm or more to 0.430 nm or less.

4. The coated cutting tool according to claim 1, wherein an average thickness $T_1$ of each of the layers of the first composite nitride layer is from 4 nm or more to 200 nm or less.

5. The coated cutting tool according to claim 1, wherein an average thickness $T_2$ of each of the layers of the second composite nitride layer is from 4 nm or more to 200 nm or less.

6. The coated cutting tool according to claim 1, wherein a ratio $[T_1/T_2]$ of an average thickness $T_1$ of each of the layers of the first composite nitride layer to an average thickness $T_2$ of each of the layers of the second composite nitride layer is from 0.10 or more to 1.30 or less.

7. The coated cutting tool according to claim 1, wherein a ratio $[T_1/T_2]$ of an average thickness $T_1$ of each of the layers of the first composite nitride layer to an average thickness $T_2$ of each of the layers of the second composite nitride layer is from 0.10 or more to 0.90 or less.

8. The coated cutting tool according to claim 1, wherein an average thickness of the alternating laminate structure is from 1.5 μm or more to 12.0 μm or less.

9. The coated cutting tool according to claim 1, wherein:
   the coating layer includes a lower layer between the substrate and the alternating laminate structure;
   the lower layer is formed of a single layer or a laminate of a compound containing an element of at least one kind selected from the group consisting of Ti, Zr, Hf, V, Nb, Ta, Cr, Mo, W, Al, Si and Y; and an element of at least one kind selected from the group consisting of C, N, O and B; and
   an average thickness of the lower layer is from 0.1 μm or more to 3.5 μm or less.

10. The coated cutting tool according to claim 1, wherein:
    the coating layer includes an upper layer on a surface of the alternating laminate structure;
    the upper layer is formed of a single layer or a laminate of a compound containing an element of at least one kind selected from the group consisting of Ti, Zr, Hf, V, Nb, Ta, Cr, Mo, W, Al, Si and Y; and an element of at least one kind selected from the group consisting of C, N, O and B; and an average thickness of the upper layer is from 0.1 μm or more to 3.5 μm or less.

11. The coated cutting tool according to claim 1, wherein the entire coating layer has an average thickness of from 1.5 μm or more to 15.0 μm or less.

12. The coated cutting tool according to claim 1, wherein the substrate is a cemented carbide, cermet, ceramic or a cubic boron nitride sintered body.

13. The coated cutting tool according to claim 2, wherein the second composite nitride layer includes a phase having a crystal system of a cubic crystal and a lattice constant of from 0.400 nm or more to 0.430 nm or less.

14. The coated cutting tool according to claim 2, wherein an average thickness $T_1$ of each of the layers of the first composite nitride layer is from 4 nm or more to 200 nm or less.

15. The coated cutting tool according to claim 3, wherein an average thickness $T_1$ of each of the layers of the first composite nitride layer is from 4 nm or more to 200 nm or less.

16. The coated cutting tool according to claim 13, wherein an average thickness $T_1$ of each of the layers of the first composite nitride layer is from 4 nm or more to 200 nm or less.

17. The coated cutting tool according to claim 2, wherein an average thickness $T_2$ of each of the layers of the second composite nitride layer is from 4 nm or more to 200 nm or less.

18. The coated cutting tool according to claim 3, wherein an average thickness $T_2$ of each of the layers of the second composite nitride layer is from 4 nm or more to 200 nm or less.

19. The coated cutting tool according to claim 4, wherein an average thickness $T_2$ of each of the layers of the second composite nitride layer is from 4 nm or more to 200 nm or less.

20. The coated cutting tool according to claim 13, wherein an average thickness $T_2$ of each of the layers of the second composite nitride layer is from 4 nm or more to 200 nm or less.

* * * * *